(12) United States Patent
Hayashi

(10) Patent No.: US 7,843,020 B2
(45) Date of Patent: Nov. 30, 2010

(54) HIGH WITHSTAND VOLTAGE TRANSISTOR AND MANUFACTURING METHOD THEREOF, AND SEMICONDUCTOR DEVICE ADOPTING HIGH WITHSTAND VOLTAGE TRANSISTOR

(75) Inventor: Keiji Hayashi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 291 days.

(21) Appl. No.: 11/902,574

(22) Filed: Sep. 24, 2007

(65) Prior Publication Data

US 2008/0073731 A1   Mar. 27, 2008

(30) Foreign Application Priority Data

Sep. 26, 2006   (JP) ............... 2006-261562

(51) Int. Cl.
*H01L 29/78* (2006.01)
*H01L 21/336* (2006.01)

(52) U.S. Cl. ............ 257/409; 257/330; 257/331; 257/332; 257/333; 257/334; 257/289; 257/290; 257/292; 438/270; 438/271; 438/272; 438/289; 438/290; 438/291; 438/292

(58) Field of Classification Search ......... 438/270–272; 257/289, 290, 292

See application file for complete search history.

(56) References Cited

U.S. PATENT DOCUMENTS

| | | | |
|---|---|---|---|
| 5,371,024 A | 12/1994 | Hieda et al. | |
| 6,342,709 B1 * | 1/2002 | Sugawara et al. | 257/139 |
| 6,518,623 B1 | 2/2003 | Oda et al. | |
| 7,417,298 B2 * | 8/2008 | Depetro et al. | 257/510 |
| 2005/0121725 A1 * | 6/2005 | Ando et al. | 257/356 |
| 2007/0210377 A1 * | 9/2007 | Seo | 257/335 |

FOREIGN PATENT DOCUMENTS

| | | | | |
|---|---|---|---|---|
| JP | 02-192168 | | 7/1990 | |
| JP | 03-142971 | | 6/1991 | |
| JP | 04-251980 | | 9/1992 | |
| JP | 1992-251980 | * | 9/1992 | |
| JP | 4251980 A | * | 9/1992 | ............. 257/288 |
| JP | 05-102480 A | | 4/1993 | |
| JP | 06-104429 A | | 4/1994 | |
| JP | 06-136405 A | | 5/1994 | |
| JP | 06-334182 A | | 12/1994 | |

(Continued)

*Primary Examiner*—Wael M Fahmy
*Assistant Examiner*—Antonio B Crite
(74) *Attorney, Agent, or Firm*—Harness, Dickey & Pierce, P.L.C.

(57) ABSTRACT

A high withstand voltage transistor is capable of preventing its gate oxidized film from being damaged by a surge voltage/current, and includes: a gate electrode provided in a trench formed on a semiconductor substrate; a source and a drain which are respectively formed on a side of the gate electrode and another side of the gate electrode, and which are a predetermined distance away from the gate electrode; first electric field relaxation layers one of which is formed on a wall of the trench on the side of the source and another one of which is formed on a wall of the trench on the side of the drain; and second electric field relaxation layers one of which is formed between the source and the gate electrode, and another one of which is formed between the drain and the gate electrode.

4 Claims, 13 Drawing Sheets

FOREIGN PATENT DOCUMENTS

| | | |
|---|---|---|
| JP | 09-064359 A | 3/1997 |
| JP | 2001-352057 A | 12/2001 |
| JP | 2003-133546 A | 5/2003 |
| JP | 2004-039985 * | 2/2004 |
| JP | 4039985 * | 2/2004 |

* cited by examiner $b = a / \tan \theta$

US 7,843,020 B2

HIGH WITHSTAND VOLTAGE TRANSISTOR AND MANUFACTURING METHOD THEREOF, AND SEMICONDUCTOR DEVICE ADOPTING HIGH WITHSTAND VOLTAGE TRANSISTOR

This Nonprovisional application claims priority under 35 U.S.C. §119(a) on U.S. Patent Application No. 2006/261562 filed in Japan on Sep. 26, 2006, the entire contents of which are hereby incorporated by reference.

FIELD OF THE INVENTION

The present invention relates to a high withstand voltage transistor and a manufacturing method thereof. More specifically, the present invention relates to (i) a high withstand voltage transistor with a trench structure, for use in a liquid crystal driver or the like, (ii) a method of manufacturing such a high withstand voltage transistor.

BACKGROUND OF THE INVENTION

Semiconductor devices each functions as a high withstand voltage MOS transistor have been conventionally proposed. As shown in FIG. 17, the high withstand voltage MOS transistor is provided with a silicon substrate 71 which includes an isolation region 72 for element isolation and electric field relaxation layers 73. The silicon substrate 71 further has a gate electrode 75 and a gate oxidized film 74. The gate electrode 75 is formed in such a manner that two ends thereof respectively overlap the electric field relaxation layers 73, and the gate oxidized film 74 is interposed between the gate electrode 75 and the electric field relaxation layers 73. On two sides of the gate electrode 75, source and drain regions 76 having so-called offset structure is provided a certain distance away from the gate electrode 75. Usually, to ensure a high withstand voltage, the gate length and the size of the electric field relaxation layer 73 are increased to a certain degree, in the high withstand voltage MOS transistor having the above structure.

On the other hand, for example, Patent Citation 1 (Japanese Unexamined Patent Publication No. 251980/1992 (Tokukaihei 4-251980; Published on Sep. 8, 1992)) proposes a high withstand voltage MOS transistor using a trench for a purpose of achieving a higher integration. As shown in FIG. 18, to form the high withstand voltage MOS transistor, a trench 60 is first formed on an N-type semiconductor substrate 50, and then P-type impurity diffusion layers 61 are formed on side and bottom surfaces of the trench 60. Next, as shown in FIG. 19, the bottom surface of the trench 60 is further deepened to form a trench 62. Then, as shown in FIG. 20, an oxidized film 63 is formed through a thermal oxidation or the like on the outer layer including the side and bottom surfaces of the trench 62. Then, a polysilicon film is formed through a CVD method on the entire superior surface of the semiconductor substrate 50 including the trench 62. The polysilicon film is patterned into a gate electrode 64 through photo lithography and etching. A low concentration diffusion layer 65 for P-LDD is formed. At the ends of the gate electrode 64, side walls 66 are formed. Then, through a conventional manufacturing method, P-type high concentration impurity diffusion layers 67 are formed. Thus, a P-type high withstand voltage MOS transistor as shown in FIG. 20 and FIG. 21 is obtained.

The P-type high withstand voltage MOS transistor thus obtained has the gate electrode 64 which is formed so as to cover the trench 62. At the ends of the gate electrode 64, the side walls 66 are provided. Adjacently to the side walls 66, the P-type high concentration impurity layers 67 to become source and drain regions are arranged. The P-type high concentration impurity layers 67 and the trench 62 are surrounded by an isolation region 68 formed through LOCOS method. In a region where the gate electrode 64 overlaps the isolation region 68, a contact region 69 to be connected to metal wiring is formed.

Since this high withstand voltage MOS transistor has the P-type impurity diffusion layers 61 which serve as electric field relaxation layers on the side surfaces of the trench 62, an area taken by the transistor is reduced. However, since the trench 62 is formed by further deepening the trench 60 after the trench 60 is formed, the process of manufacturing becomes complicated. This consequently raises the production cost and decreases the yield.

Further, it is necessary to form the side wall on each side surface of the gate electrode 64, and to form the contact region 69 on the isolation region 68 for connecting the gate electrode 64 to metal wiring. This reduces an amount by which the high withstand voltage MOS transistor is downsized.

In order to solve the problem, for example, Japanese Unexamined Patent Publication No. 2004-39985 (Tokukai 2004-39985; Published on Feb. 5, 2004) (Patent Citation 2) proposes a high withstand voltage MOS transistor in which a drift diffusion region is formed on walls of a trench, by implanting ion at an oblique angle. As shown in FIG. 22, in the high withstand voltage MOS transistor, a trench 41 is formed on a semiconductor substrate 40, and a drift diffusion layer 42 is formed on the walls of the trench 41, by implanting ion at an oblique angle. At this point, the ion is not implanted to the bottom of the trench 41. This is because the edges at the top of the trench 41 block implantation of the ion into the bottom surface.

Then, as shown in FIG. 23, a gate oxidized film 43 is formed on the walls and the bottom surface of the trench 41, and a gate electrode 44 is buried into the trench 41. Then, through ion implantation, a high concentration impurity diffusion layer 45, an interlayer insulation film 46 and drain/source/gate electrode wiring 47 are formed. Thus, a high withstand voltage MOS transistor as shown in FIG. 23 is obtained.

The high withstand voltage MOS transistor shown in FIG. 23 allows a high integration, and its manufacturing method is simplified. However, since the gate electrode 44 is adjacent to the high concentration impurity diffusion layer 45, the withstand voltage of the high withstand voltage MOS transistor is deteriorated due to an effect from the electric field at the gate electrode 44. It is therefore difficult to achieve a higher withstand voltage.

Further, as shown in FIG. 22, in formation of the drift diffusion layer 42 by implantation of ion into the walls of the trench 41 at an oblique angle, the following relation is established: (b=a/tan θ), where: θ is an implantation angle at which ion is implanted to form the drift diffusion layer 42; a is a gate length (trench 41 width); and b is a length of the drift diffusion layer 42. Accordingly, determining of the depth of the trench 41 determines one gate length (trench 41 width). Accordingly, a circuit (e.g. an output circuit of a liquid crystal driver) which is largely affected by variation in characteristics of the transistor is not able to adopt the above-described downsized high withstand voltage transistor. This is because, when designing such a circuit, it is not possible to increase the gate length to reduce an effect of variation in the accuracy of processing in the manufacturing process.

Further, in a semiconductor device of a conventional liquid crystal driver or the like, if a transistor is directly connected to output and power source terminals, and if a surge voltage is applied to the output or the power source terminal, the surge voltage will reach nearby the gate, consequently causing a problem such as damaging the gate oxidized film. For this reason, a protection resistor or a protection diode or the like is needed as an ESD protection circuit for each of the output and power source terminals, to prevent a surge voltage from affecting the internal circuit.

In recent years, in a liquid crystal driver adopting a high withstand voltage transistor, the number of output terminals has been rapidly increasing for a purpose of reducing the number of parts and the production cost of the liquid crystal panel. Since the ESD protection circuit which occupies a considerable area needs to be provided for each of the output terminals, the area needed for ESD protection circuits in a chip is no longer ignorable.

SUMMARY OF THE INVENTION

The present invention is made to solve the foregoing problems, and to provide (i) a high withstand voltage transistor and a semiconductor device using the same each of which capable of preventing a gate oxidized film from being damaged by a surge voltage/current, and (b) a manufacturing method of the high withstand voltage transistor.

In order to achieve the foregoing object, a high withstand voltage transistor of the present invention includes: a gate electrode provided in a first trench formed on a first conductive semiconductor substrate; a source and a drain one of which is formed on one side of the gate electrode, and another one of which is formed on another side of the gate electrode, the source and the drain being apart from the gate electrode by a predetermined distance; first electric field relaxation layers one of which is formed on a wall of the trench on the side of the source and another one of which is formed on a wall of the trench on the side of the drain; second electric field relaxation layers one of which is formed between the source and the gate electrode, and is extended so as to surround the source, and another one of which is formed between the drain and the gate electrode, and is extended so as to surround the drain, wherein a withstand voltage of a drain/source diffusion layer is 1 to 3V lower than that of the transistor.

When the difference of the withstand voltage is not more than 1V, the following takes place. When a surge voltage is applied from outside to the transistor, the surge voltage reaches the gate before the surge current starts to flow from the source/drain diffusion region into the substrate. Consequently, the transistor is damaged. On the contrary, when the difference is 3V or more, the following takes place. The surge current flows from the source/drain diffusion region into the substrate, and the surge voltage never reaches the gate. However, this causes an increase in the size of the transistor to ensure high withstand voltage of the transistor.

In order to achieve the foregoing object, a method of the present invention for manufacturing a high withstand voltage transistor includes the steps of: (I) forming a first trench on a semiconductor substrate, and burying a CVD oxidized film; (II) forming a first photoresist having an opening which is wider than the width of the first trench by an intended amount; (III) implanting a first ion of a second conduction type, using the first photoresist as a mask; and (IV) forming first electric field relaxation layers along walls of the first trench.

In order to achieve the foregoing object, a semiconductor device of the present invention includes: the high withstand voltage transistor of the present invention; and an output terminal connected to the high withstand voltage transistor.

In order to achieve the foregoing object, a high withstand voltage transistor of the present invention is formed as follows. A first conductive substrate is formed so that: (i) a substrate impurity concentration in a second position of the substrate which is deeper than a first position is lower than a substrate impurity concentration in the first position; and a substrate impurity concentration in a third position of the substrate which is deeper than the second position is higher than the substrate impurity concentration in the second position. On the semiconductor substrate, a trench is formed so that its bottom surface is in the second position. In the trench a CVD oxidized film is buried. A first ion of a second conduction type is implanted along walls on two sides of the trench, thereby forming first electric field relaxation layers. The CVD oxidized film in the trench is removed and a gate electrode is buried in the trench, and an insulation film having an intended width for covering the gate electrode is formed. a second ion of a second conduction type is implanted, using the insulation film as a mask, so as to form a source on one side of the insulation film and a drain on another side. Then, a third ion of the second conduction type is implanted so as to form second electric field relaxation layers. One of the second electric field relaxation layers is formed between the gate electrode and the source, and is extended below the source. Another one of the second electric field relaxation layers is formed between the gate electrode and the drain, and is extended below the drain.

Thus, the first conductive substrate is formed so that: (i) the substrate impurity concentration in the second position of the substrate which is deeper than the first position is lower than the substrate impurity concentration in the first position; and the substrate impurity concentration in the third position of the substrate which is deeper than the second position is higher than the substrate impurity concentration in the second position. The first ion of the second conduction type is implanted along the walls on two sides of the trench, thereby forming the first electric field relaxation layers. Then, a third ion of the second conduction type is implanted so as to form second electric field relaxation layers. One of the second electric field relaxation layers is formed between the gate electrode and the source, and is extended below the source. Another one of the second electric field relaxation layers is formed between the gate electrode and the drain, and is extended below the drain. Since the substrate impurity concentration in each second electric field relaxation layer is higher than the substrate impurity concentration of the first electric field relaxation layer, the drain/source junction withstand voltage is lower than the withstand voltage of the transistor. Accordingly, when a surge voltage is applied to an output terminal of the semiconductor device including the high withstand voltage transistor, the surge current flows from the drain and source (high concentration diffusion layers) to the semiconductor substrate, and is rapidly attenuated. Therefore, the surge current does not reach the gate electrode of the high withstand voltage transistor. As a result, it is possible to prevent the gate oxidized film from being damaged by the surge voltage/current.

Additional objects, features, and strengths of the present invention will be made clear by the description below. Further, the advantages of the present invention will be evident from the following explanation in reference to the drawings.

DESCRIPTION OF THE EMBODIMENTS

An embodiment of the present embodiment is described below with reference to FIG. 1 to FIG. 15.

Figure 1:
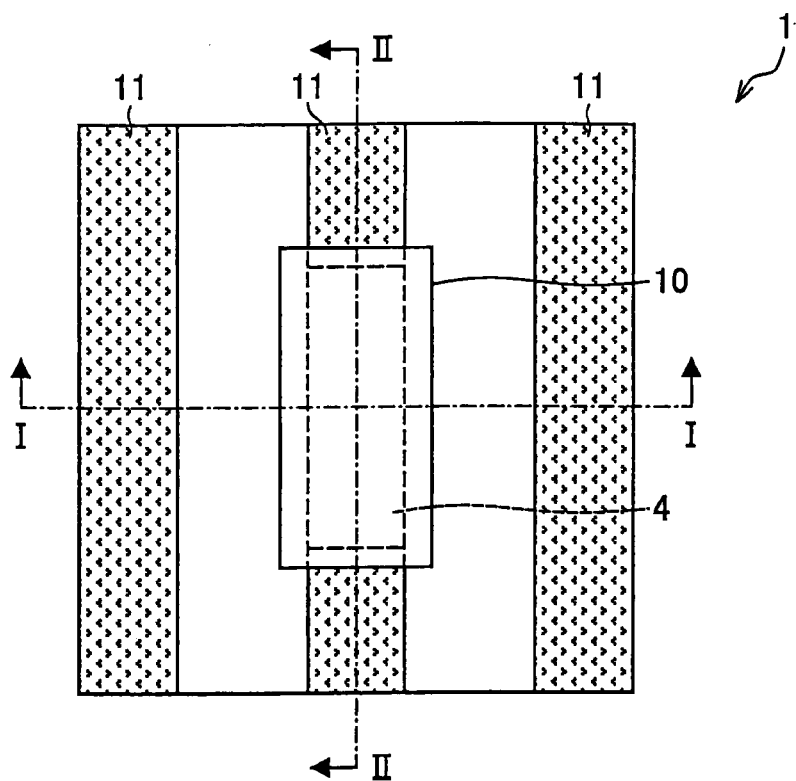
FIG. 1 is a plane view showing a configuration of a high withstand voltage transistor of an embodiment.
Figure 2:
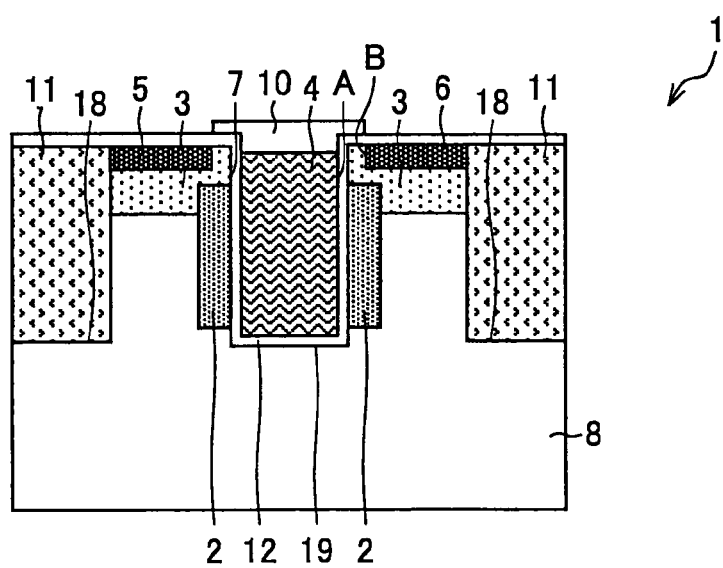
FIG. 2 is a cross sectional view taken along the line I-I shown in FIG. 1.
Figure 3:
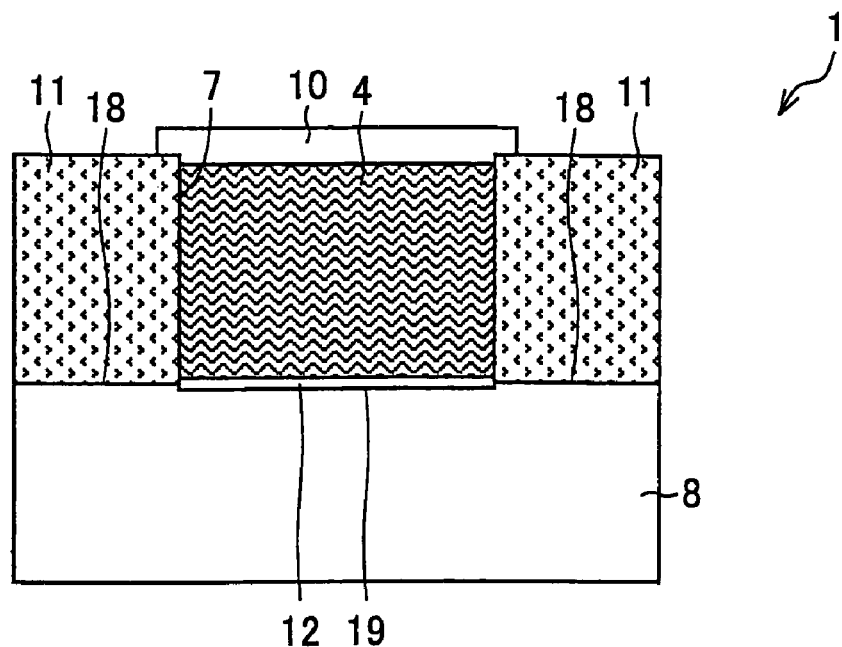
FIG. 3 is a cross sectional view taken along the line II-II shown in FIG. 1.

FIG. 1 is a plane view showing a configuration of a high withstand voltage transistor 1 of the present embodiment. FIG. 2 is a cross sectional view taken along the line I-I of FIG. 1. FIG. 3 is a cross sectional view taken along the line II-II shown in FIG. 1. When viewed the high withstand voltage transistor 1 in the direction perpendicular to the surface of the semiconductor substrate 8, the high withstand voltage transistor 1 includes stripe CVD oxidized films 11 which are arranged in parallel to one another. As shown in FIG. 1 and FIG. 2, a gate electrode 4 is buried in a trench 7 which is formed by cutting the CVD oxidized films 11 arranged in the middle. A gate oxidized film 12 is formed so as to cover the bottom surface and two side surfaces of the trench 7 and the surface of semiconductor substrate 8.

On one side of the gate electrode 4, a source 5 is formed apart from the gate electrode 4 by a predetermined distance. On another side of the gate electrode 4, a drain 6 is formed apart from the gate electrode 4 by a predetermined distance. The source 5 and the drain 6 are exposed on the surface of the semiconductor substrate 8. Along a wall of the trench 7 on the side of the source 5, an electric field relaxation layer 2 is formed at a predetermined depth. Along another wall of the trench 7 on the side of the drain 6, another electric field relaxation layer 2 is formed at a predetermined depth. An electric field relaxation layer 2 is formed at a predetermined depth along a wall of the trench 7 on the side of the source 5, and another electric field relaxation layer 2 is formed at a predetermined depth along a wall of the trench 7 on the side of the drain 6. An electric field relaxation layer 3 is formed between the gate electrode 4 and the source 5, and another electric field relaxation layer 3 is formed between the gate electrode and the drain 6. Each of the electric field relaxation layers 3 is extended to a position deeper than the top surface of the electric field relaxation layer 2.

Each of The CVD oxidized films 11 is buried into the semiconductor substrate 8 to isolate elements. The gate electrode 4 is buried so as to be adjacent to the CVD oxidized film 11 in the middle. Each of the source 5 and the drain 6 is made of an N-type high concentration impurity diffusion layer which becomes a drain/source diffusion region. Further, an insulation film 10 covers the gate electrode 4. The insulation film 10 serves as a mask when a high concentration impurity is implanted into the surface of the semiconductor substrate 8 so as to turn the surface of the semiconductor substrate 8 into the drain/source diffusion region. The direction of the cross section of FIG. 2 taken along the line I-I is the direction of the gate length of the high withstand voltage transistor. The direction of the cross section of FIG. 3 taken along the line II-II is the direction of the gate width of the high withstand voltage transistor.

As shown in the cross section of FIG. 2 in the direction of the gate length of the high withstand voltage transistor, the gate oxidized film 12 is formed through thermal oxidation with respect to the walls and the bottom surface of the trench 7. The gate electrode 4 buried is located above this gate oxidized film 12. The insulation film 10 having an intended width covers the gate electrode 4. The source 5 and the drain 6 are formed on a surface of the semiconductor substrate 8, one of which on one side of the insulation film 10, and another one of which on another side. On each side surface of the trench 7, the electric field relaxation layer 2 is formed. An electric field relaxation layers 3 is formed between the source 5 and the gate electrode 4, and between the source 5 and the electric field relaxation layer 2. Another electric field relaxation layer 3 is also formed between the drain 6 and the gate electrode 4, and between the drain 6 and the electric field relaxation layer 2. A channel region 19 is formed on the bottom surface of the trench 7.

As shown in the cross section of FIG. 3 in the direction of the gate width of the transistor, the sides of the gate electrode 4 is adjacent to the CVD oxidized film 11 for isolating elements. The insulation film 10 having an intended width is formed and covers the gate electrode 4. A channel region 19 is formed on the bottom surface of the gate electrode 4.

Figure 4:
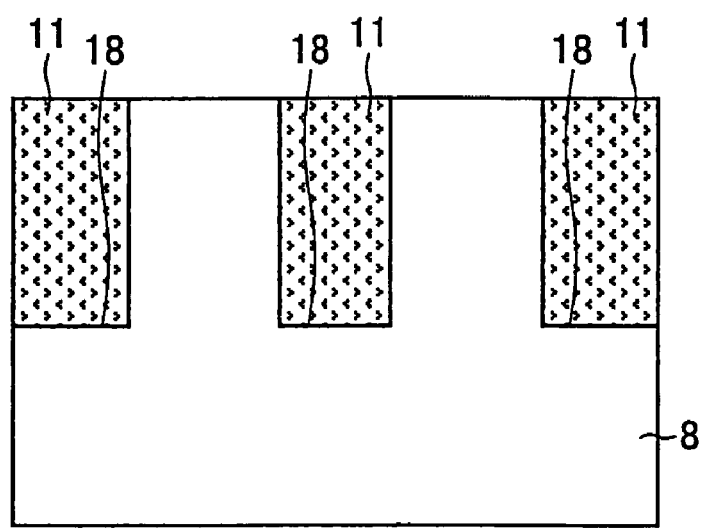
FIG. 4 is a cross sectional view taken along the line I-I for explaining a manufacturing method of the high withstand voltage transistor.

FIG. 4 is a cross sectional view taken along the line I-I for explaining a manufacturing method of the high withstand voltage transistor 1. First, as shown in FIG. 4, trenches 18 of 0.3 to 2 μm in depth for isolating elements are formed on a P-type semiconductor substrate 8. In each of the trenches 18, CVD oxidized films 11 are buried as shown in FIG. 4. For example, the CVD oxidized film 11 may be buried through a CMP process or the like. The width of the trench 18 is, for example, 0.3 to 1 μm. The depth and width of the trench 18 is determined according to the required withstand voltage of the high withstand voltage transistor. Higher the required withstand voltage of the transistor is, the larger the dimension of the trench will becomes. The above exemplified dimension will yield a transistor whose withstand voltage is between 10 to 100V.

The following describes an example of an N-ch transistor whose withstand voltage is 30V. In this example, the width of the trench 18 is 0.4 μm, and the depth of the trench 18 is 0.8 μm.

Figure 5:
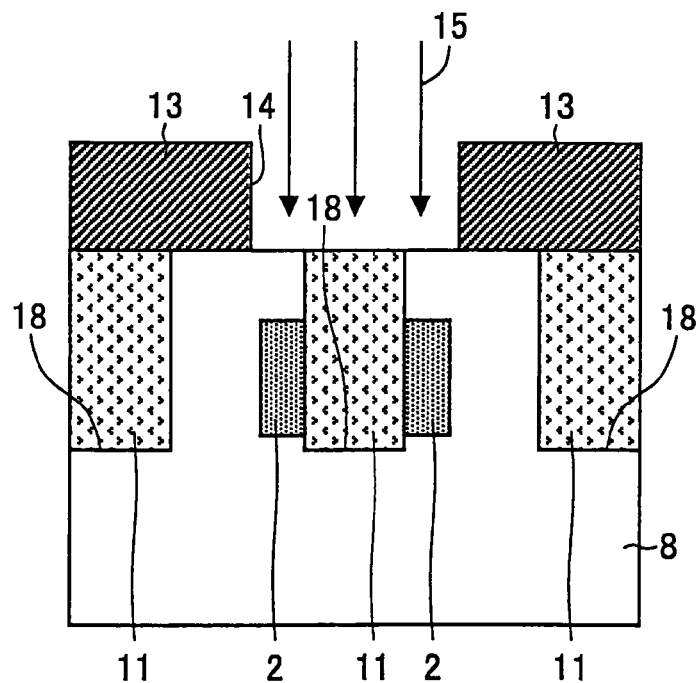
FIG. 5 is a cross sectional view taken along the line I-I for explaining the manufacturing method of the high withstand voltage transistor.
Figure 6:
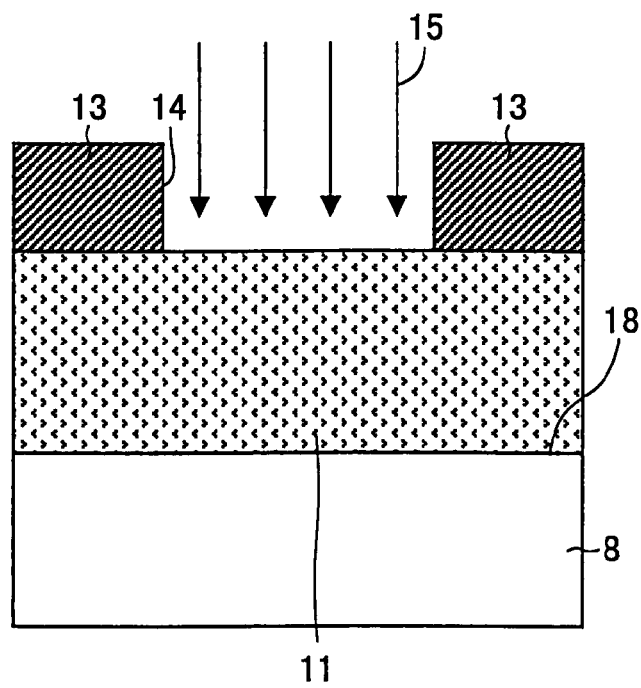
FIG. 6 is a cross sectional view taken along the line II-II for explaining the manufacturing method of the high withstand voltage transistor.

FIG. 5 is a cross sectional view taken along the I-I for explaining the manufacturing method of the high withstand voltage transistor 1. FIG. 6 is a cross sectional view taken along the II-II. Next formed is a photo resist pattern 13 having an opening 14 in a position corresponding to a position where a high withstand voltage transistor will be formed through a photo lithography. Here, the opening 14 of the photo resist pattern 13 is formed so that two sides of the trench 18 are within the region where the opening 14 is formed. For example, the size of the opening 14 is 0.8 to 1.0 μm (the width of the trench 18 (0.4 μm) plus extra 0.2 to 0.3 μm on the two sides of the trench 18). Ion 15 is implanted using the photo resist pattern 13 as a mask, and electric field relaxation layers 2 are formed in lower portions of walls on the two sides of the trench 18. Each of the electric field relaxation layers 2 is made of a drift diffusion layer. For example, the ion 15 which is phosphorous is implanted at 300 keV into an area of $8.0 \times 10^{12}$ $cm^2$, and at 150 keV into an area of $1.0 \times 10^{13}$ $cm^2$.

Figure 7:
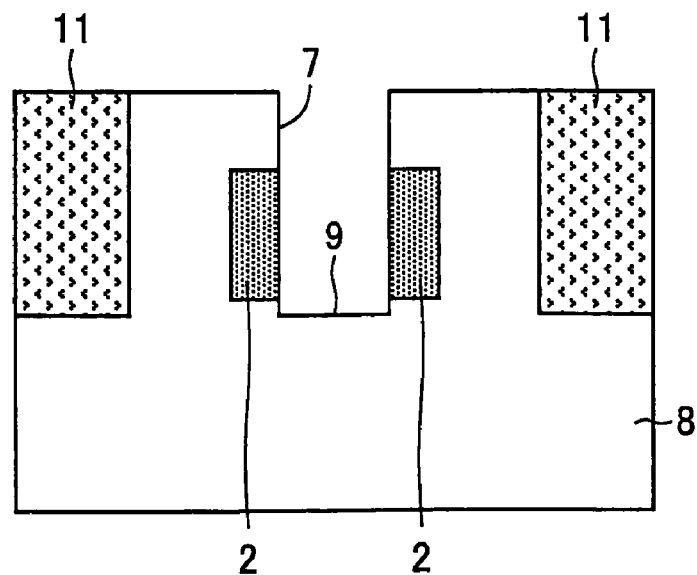
FIG. 7 is a cross sectional view taken along the line I-I for explaining the manufacturing method of the high withstand voltage transistor.
Figure 8:
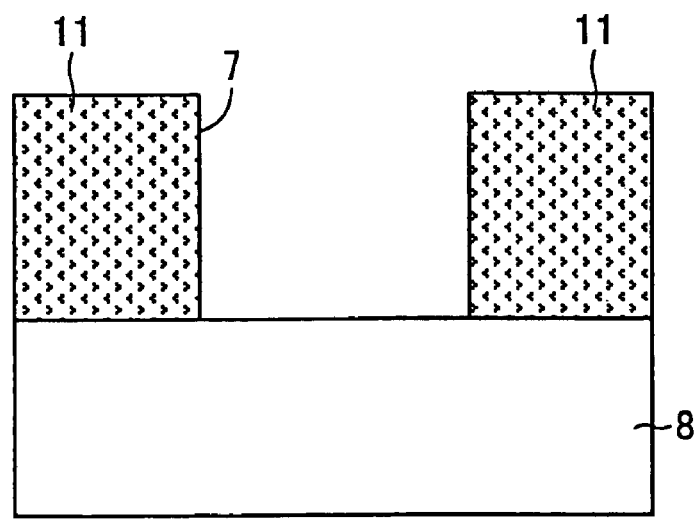
FIG. 8 is a cross sectional view taken along the line II-II for explaining the manufacturing method of the high withstand voltage transistor.

FIG. 7 is a cross sectional view taken along I-I for explaining the manufacturing method of the high withstand voltage transistor 1. FIG. 8 is a cross sectional view taken along the II-II. As shown in FIG. 7 and FIG. 8, a trench 7 is formed by partially removing the CVD oxidized film 11 in the trench 18, using the photo resist pattern 13 as a mask. Here, the width of the trench 7 in FIG. 7 will be the gate length of the high withstand voltage transistor, and the width of the trench 7 in FIG. 8 will be the gate width of the high withstand voltage transistor.

Figure 9:
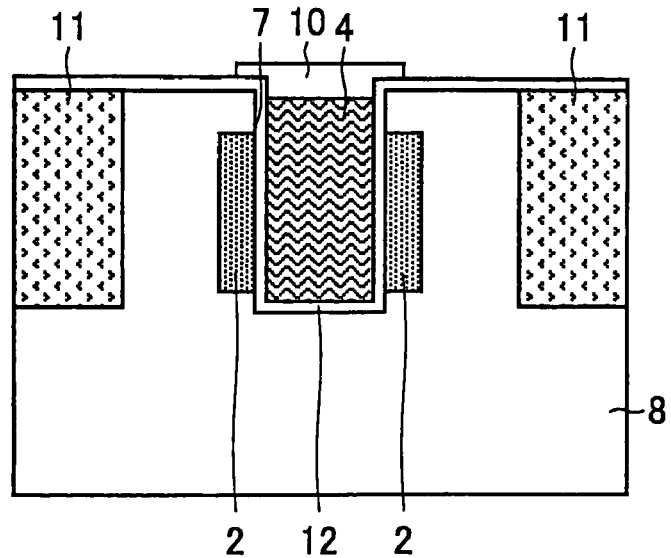
FIG. 9 is a cross sectional view taken along the line I-I for explaining the manufacturing method of the high withstand voltage transistor.
Figure 10:
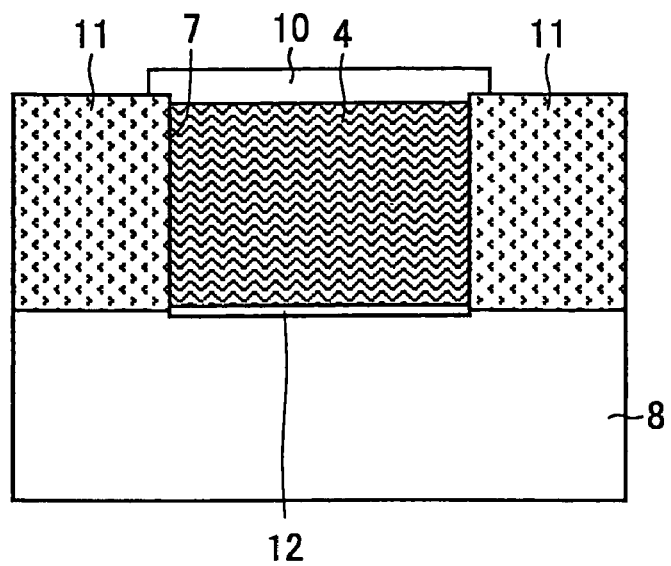
FIG. 10 is a cross sectional view taken along the line II-II for explaining the manufacturing method of the high withstand voltage transistor.

FIG. 9 is a cross sectional view taken along I-I for explaining the manufacturing method of the high withstand voltage transistor 1. FIG. 10 is a cross sectional view taken along the II-II. Through a sacrificial oxidation, the inner walls of the trench 7 is sacrificially oxidized. Then, the inner walls of the trench 7 is again oxidized after removing the sacrificially oxidized film, thus forming a gate oxidized film 12. After that, the gate electrode 4 is buried into the trench 7 through a CMP method for example.

Then, an insulation film for forming a side wall of a logic transistor is deposited, and through a photo lithography, the insulation film 10 is formed so as to cover, for example, 0.1 to 0.3 μm on two sides of the gate electrode 4. Here, for example, the thickness of the sacrificially oxidized film is 20 to 50 nm. The thickness of the gate oxidized film 12 is 50 to 80 nm. For example, when the insulation film 10 is a CVD oxidized film, the thickness of the insulation film 10 is 100 nm. However, the insulation film 10 may be a CVD SiN film, a CVD SiN/SiO$_2$ compound film. Note however that the thickness of the insulation film 10 must be such that the later-described ion 16 is blocked but that a third ion 17 is able to go through.

Here, when the width of the insulation film 10 is larger than the width of the gate electrode 4 by not more than 0.1 μm on each side, the withstand voltage of the transistor is deteriorated due to an effect from the electric field of the gate electrode. On the other hand, when the width of the insulation film 10 is larger than the width of the gate electrode 4 by 0.4 μm or more on each side, downsizing of the transistor becomes difficult.

Figure 11:
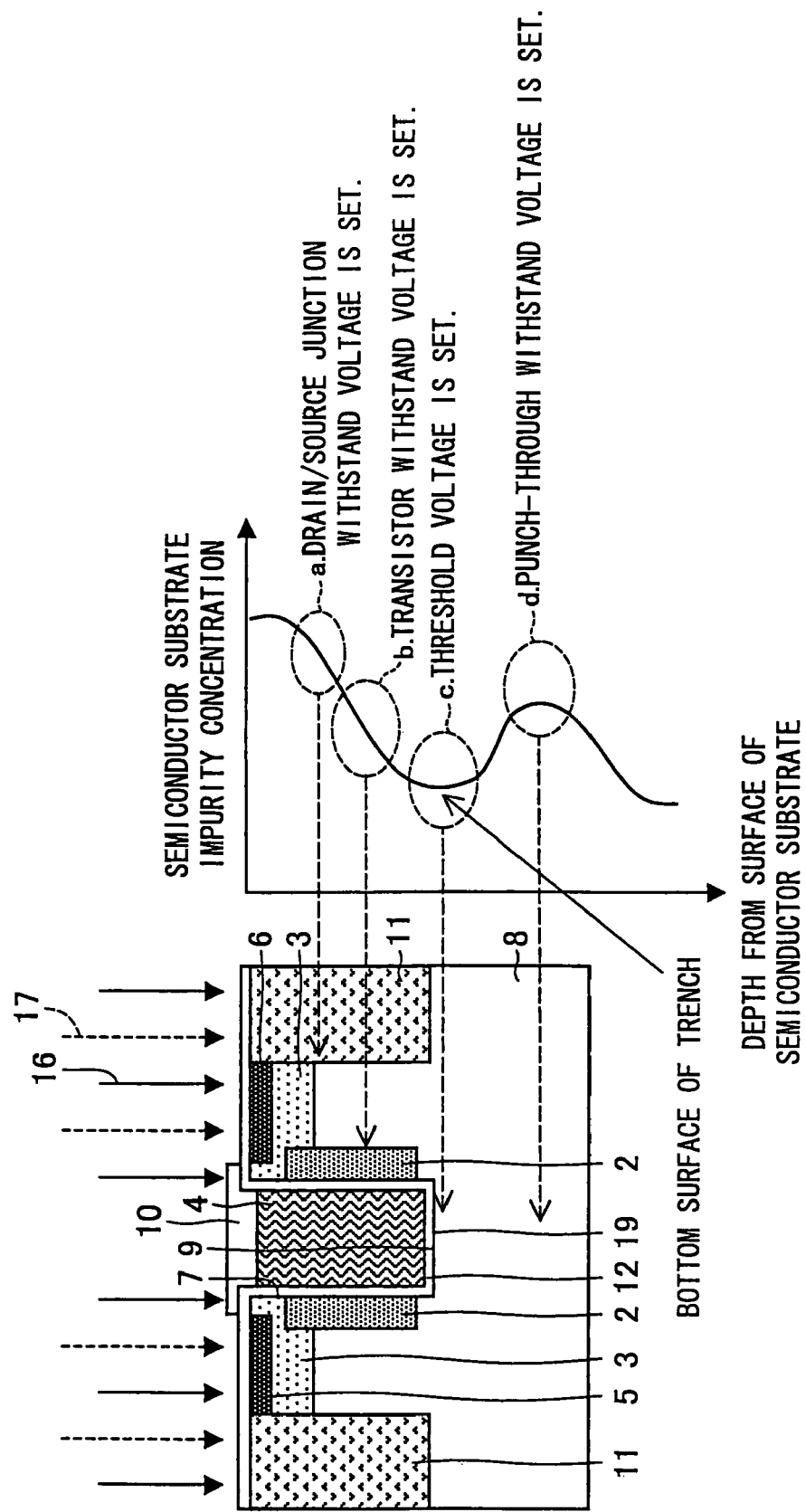
FIG. 11 is a diagram for explaining the manufacturing method of the high withstand voltage transistor.

FIG. 11 is an explanatory diagram showing a manufacturing method of the high withstand voltage transistor 1. As shown in FIG. 11, a high concentration diffusion layer to become the source 5 and the drain 6 is formed as follows. The ion 16 is implanted using the insulation film 10 as a mask. Further, the ion 17 is implanted so as to penetrate the insulation film 10 and reach the electric field relaxation layer 2. Thus, the source 5, the drain 6, and the second electric field relaxation layer 3 each of which is made of a high concentration diffusion layer are formed. Here, for example, the ion 16 is arsenic, and is implanted at 40 keV into an area of $5 \times 10^{15}$ $cm^2$. Further, for example, the ion 17 is phosphorous, and is implanted at 100 keV into an area of $4 \times 10^{12}$ $cm^2$.

Figure 12:
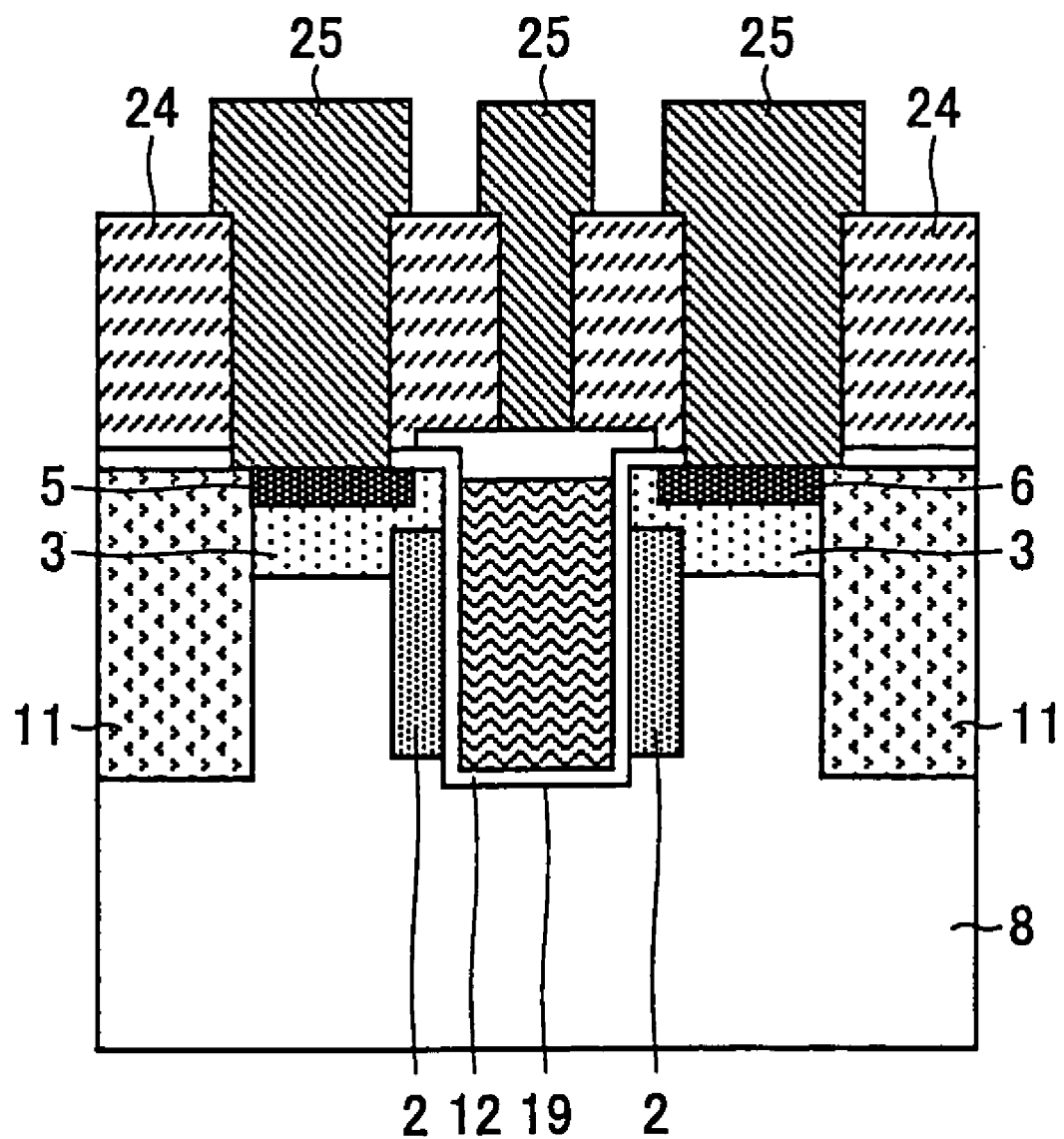
FIG. 12 is a cross sectional view taken along the line I-I for explaining the manufacturing method of the high withstand voltage transistor.

FIG. 12 is a cross sectional view taken along the line I-I for explaining a manufacturing method of the high withstand voltage transistor 1. After that, CVD oxidized films 24 are formed through a process of manufacturing a semiconductor device. Respective lines 25 connecting to the drain, the source and the gate electrode is formed. Thus, an N-type high withstand voltage transistor as shown in FIG. 12 is formed.

Here, as shown in FIG. 11, the withstand voltage of the high withstand voltage transistor can be determined by the electric field relaxation layer 2 formed by implantation of the ion 15; and distribution of the impurity concentration in a portion of the semiconductor substrate 8 nearby the electric field relaxation layer 2. On the other hand, a drain/source junction withstand voltage is determined by: the source 5 and drain 6 (high concentration diffusion layer) which are formed by implantation of ions 16 and 17; and distribution of the impurity concentration in the electric field relaxation layer 3 and in the semiconductor substrate 8 nearby the electric field relaxation layer 3. As described, the withstand voltage of the high withstand voltage transistor and the drain/source junction withstand voltage can be independently determined.

Specifically, the distribution of the impurity concentration in the semiconductor substrate 8 and the conditions of implanting the ions 15, 16, and 17 are set so that the withstand voltage of the high withstand voltage transistor is 2V lower than the drain/source junction withstand voltage.

The distribution of the impurity concentration in the semiconductor substrate 8 is achieved as follows. For example, boron is implanted at 50 keV into an area of $2.0 \times 10^{13}$ $cm^2$ of P-type silicon whose specific resistance is 10 Ωcm, at 150 keV into an area of $1.0 \times 10^{12}$ $cm^2$ of the P-type silicon, at 400 keV into an area of $1.0 \times 10^{12}$ $cm^2$ of the P-type silicon, and at 800 keV into an area of $1.0 \times 10^{13}$ $cm^2$ of the P-type silicon. That way the distribution of the impurity concentration is set so that: the impurity concentration is $3 \times 10^{17}$ $cm^3$ in a portion of the semiconductor substrate 8 nearby the electric field relaxation layer 3 formed by implantation of the ion 17; the impurity concentration is $5 \times 10^{16}$ $cm^3$ in a portion of the semiconductor substrate 8 nearby the bottom surface 9 of the trench 7; and the impurity concentration is $1.5 \times 10^{17}$ $cm^3$ in a portion of the semiconductor substrate 8 under the bottom surface of the trenches 7 and 18.

FIG. 11 shows distribution of the impurity concentration in the semiconductor substrate 8 in relation to the depth of the semiconductor substrate 8 from its surface, along with a function of each portion. The impurity concentration at a position a is set so as to achieve an intended drain/source junction withstand voltage. The impurity concentration at a position b is set so as to achieve an intended withstand voltage of the transistor. The impurity concentration at a position c is set so as to set the threshold voltage of the transistor at an intended value. The impurity concentration at a position d is set so as to achieve an intended punch-through withstand voltage between elements of the transistor.

Then, through a formation of the high withstand voltage transistor of the above embodiment, the withstand voltage of the transistor is made 30V, and the withstand voltage at the source-drain diffusion region is made 28V.

It is possible to achieve a transistor withstand voltage and a drain/source junction withstand voltage which fall within a range from 10 to 100 V by modifying, according to the required withstand voltage, (i) distribution of the impurity concentration of the semiconductor substrate 8, (ii) the dimension (depth and width) of the trench 7, (iii) conditions of implanting ions 15, 16, and 17, and (iv) the thickness of the gate oxidized film 12. In this case, the depth of the trench 7 is 0.4 to 2 μm, the width of the trench 7 is 0.3 to 1 μm, the impurity concentration at a portion of the semiconductor substrate 8 nearby the electric field relaxation layer 3 formed by implantation of the ion 17 is $5 \times 10^{15}$ to $5 \times 10^{17}$ cm$^3$, the impurity concentration at a portion of the semiconductor substrate 8 nearby the bottom surface of the trench 7 is $1 \times 10^{15}$ to $1 \times 10^{17}$ cm$^3$, and the thickness of the gate oxidized film 12 is 28 to 300 nm.

Figure 13:
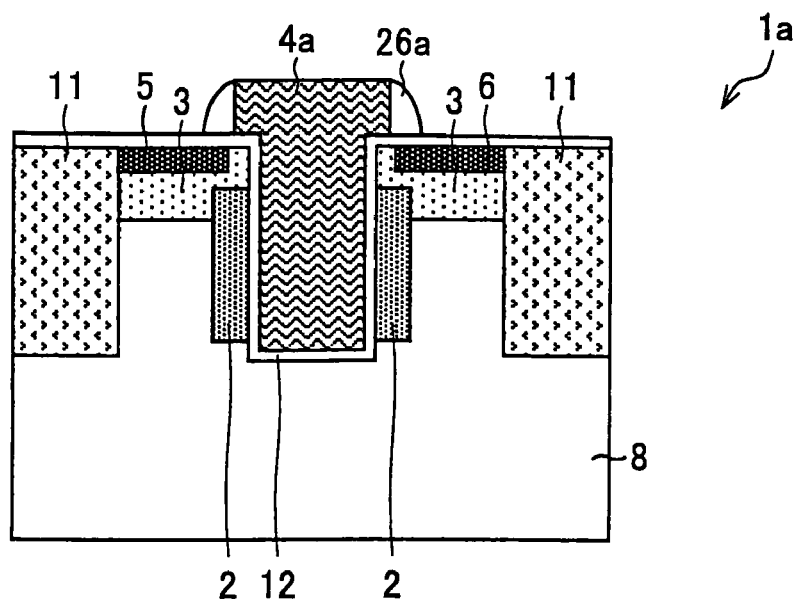
FIG. 13 is a cross sectional view of the embodiment which shows a configuration of an alternative form of the high withstand voltage transistor.

FIG. 13 is a cross sectional view showing a configuration of a high withstand voltage transistor 1a which is an alternative form of the present embodiment. The same symbols are given to members identical to those described hereinabove, and detailed explanations therefor are omitted here.

The high withstand voltage transistor 1a includes a gate electrode 4a which is formed so as to project from the surface of a semiconductor substrate 8. A side wall 26a is formed on each of two side surfaces of the gate electrode 4a on the semiconductor substrate 8. As described, the gate electrode may be formed so as to project from the surface of the semiconductor substrate 8.

Figure 14:
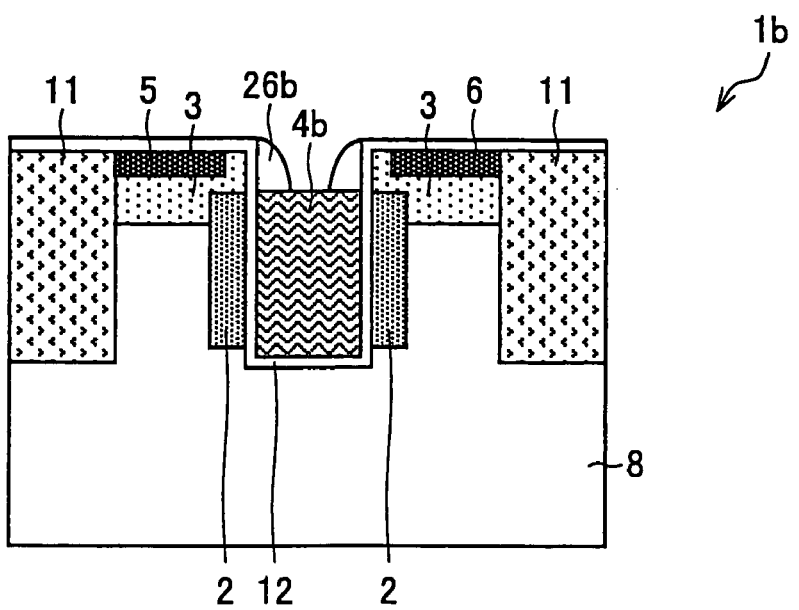
FIG. 14 is a cross sectional view of the embodiment which shows a configuration of another alternative form of the high withstand voltage transistor.

FIG. 14 is a cross sectional view showing a configuration of a high withstand voltage transistor 1b which is another alternative form of the present embodiment. The high withstand voltage transistor 1b includes a gate electrode 4b which is formed so as to be sunken down from the surface of the semiconductor substrate 8. A side wall 26b is formed on the gate electrode 4b along a wall made of a gate oxidized film 12. As described, the gate electrode may be formed so as to be sunken down from the surface of the semiconductor substrate 8.

Figure 15:
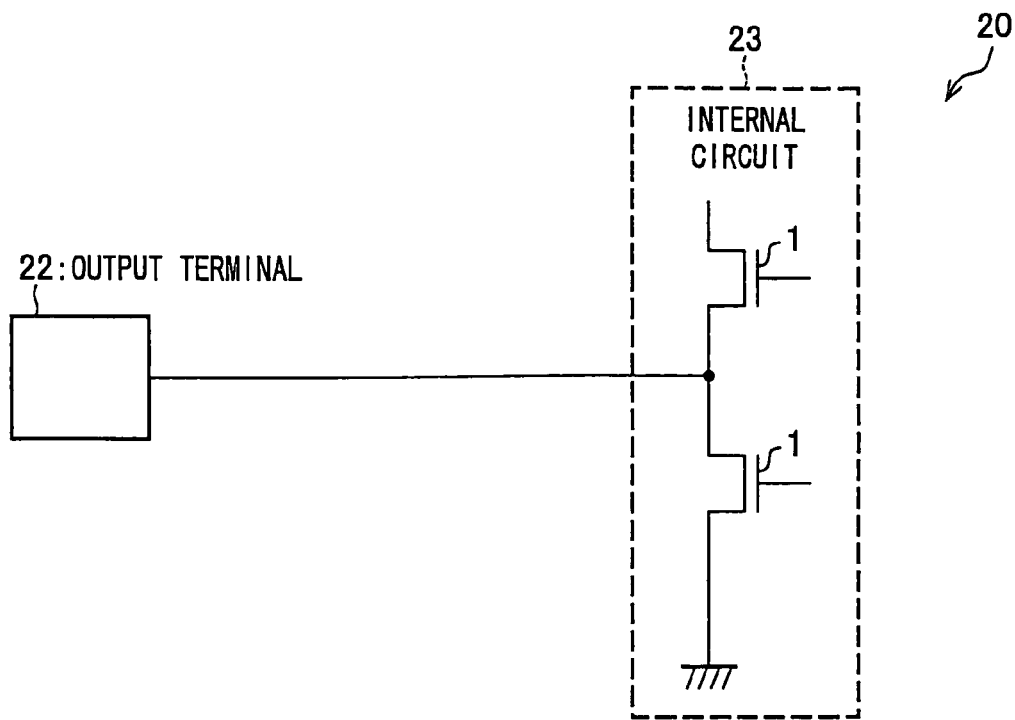
FIG. 15 is a circuit diagram showing a configuration of a semiconductor device having the high withstand voltage transistor.
Figure 16:
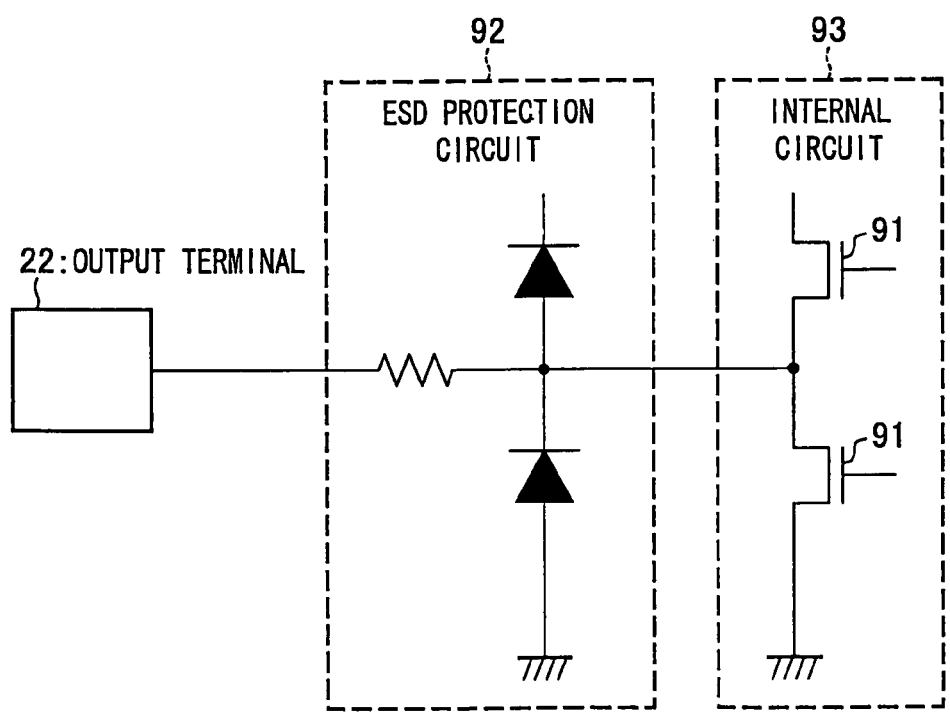
FIG. 16 is a circuit diagram showing a configuration of a semiconductor device having a conventional high withstand voltage transistor.
Figure 17:
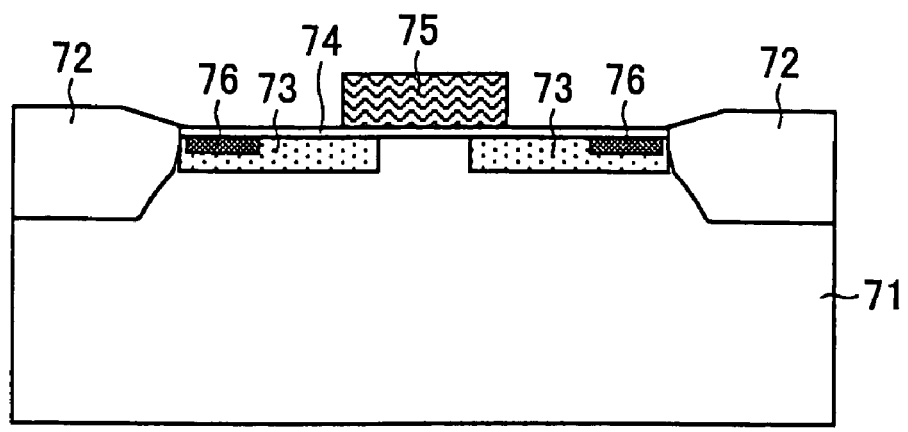
FIG. 17 is a cross sectional view showing a configuration of the conventional high withstand voltage transistor.
Figure 18:
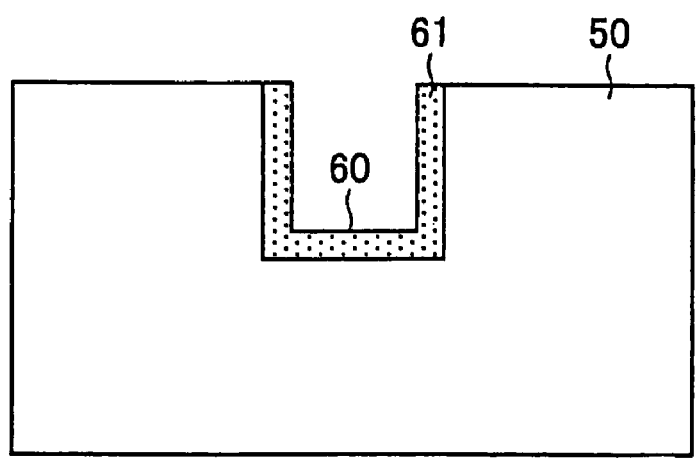
FIG. 18 is a cross sectional view for explaining a manufacturing method of another conventional high withstand voltage transistor.
Figure 19:
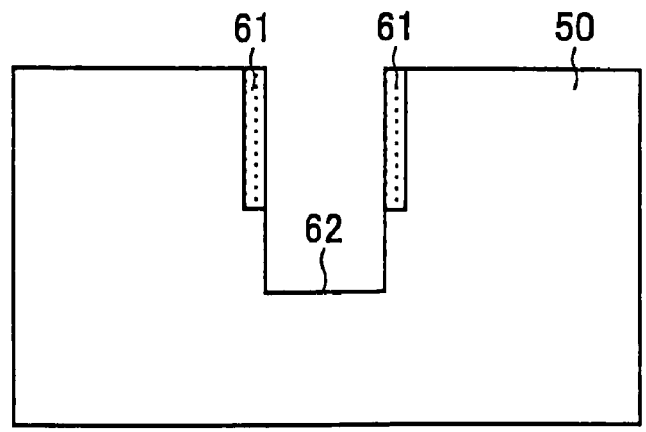
FIG. 19 is a cross sectional view for explaining a manufacturing method of the other conventional high withstand voltage transistor.
Figure 20:
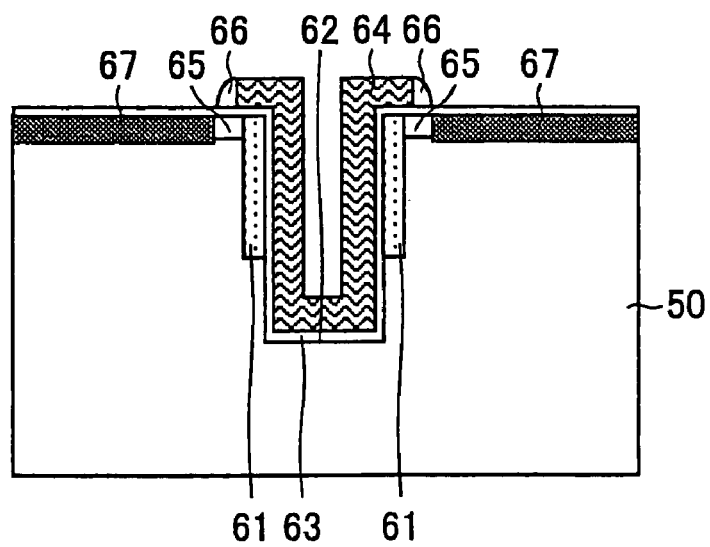
FIG. 20 is a cross sectional view for explaining a manufacturing method of the other conventional high withstand voltage transistor.
Figure 21:
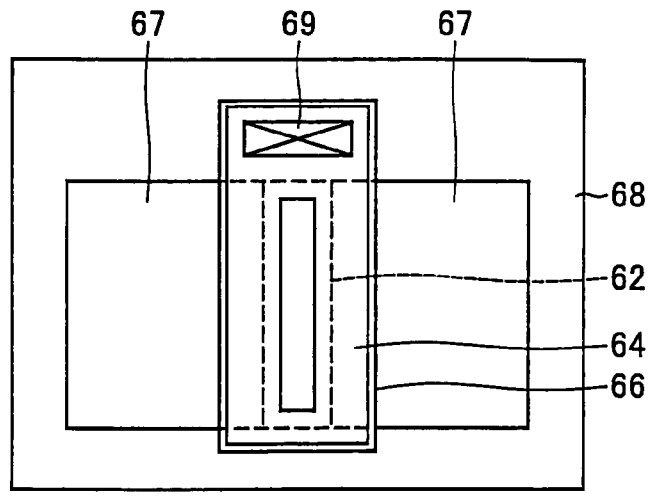
FIG. 21 is a plane view for explaining a configuration of the other conventional high withstand voltage transistor.
Figure 22:
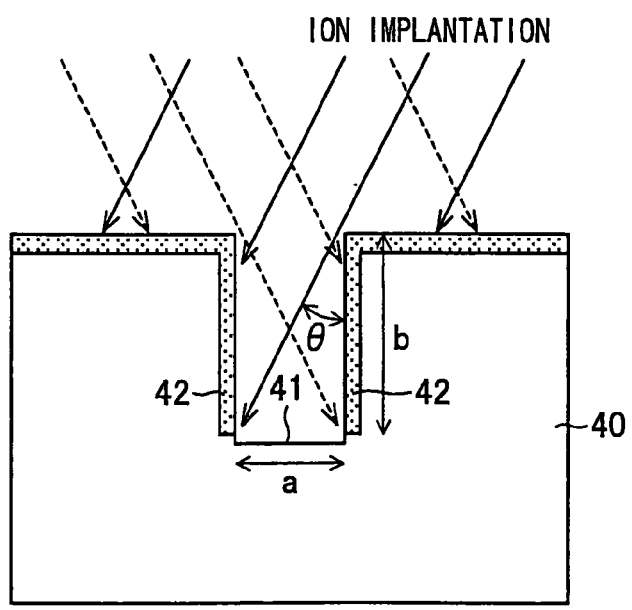
FIG. 22 is a cross sectional view for explaining a manufacturing method of yet another conventional high withstand voltage transistor.
Figure 23:
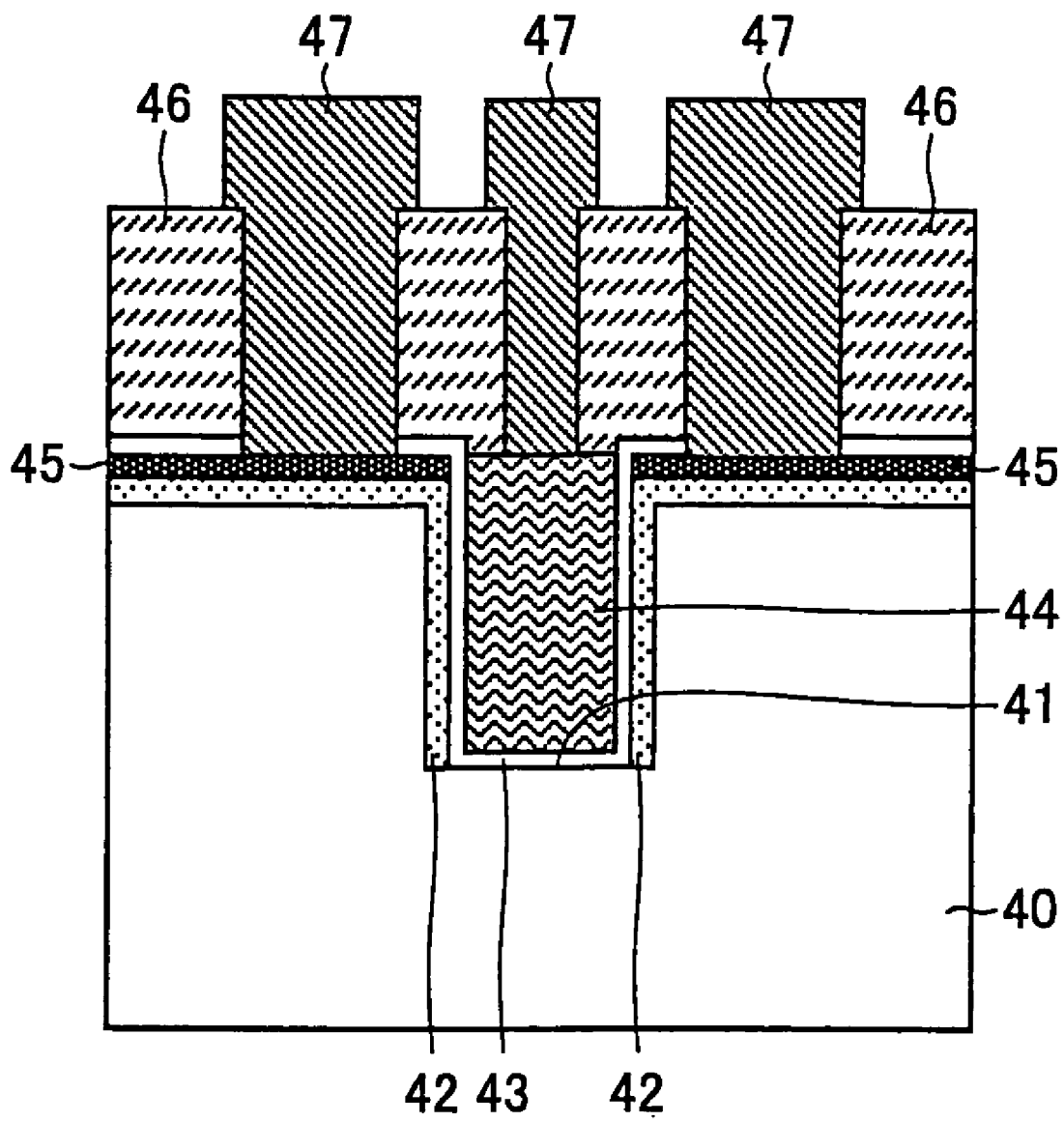
FIG. 23 is a cross sectional view for explaining a manufacturing method of yet another conventional high withstand voltage transistor.

FIG. 15 is a circuit diagram showing a configuration of a semiconductor device 20 having the high withstand voltage transistor 1. FIG. 16 is a circuit diagram showing a configuration of a semiconductor device having a conventional high withstand voltage transistor. The semiconductor device 20 includes: an internal circuit 23 having plural high withstand voltage transistors 1. Each high withstand voltage transistor 1 is directly connected to an output terminal 22.

The conventional semiconductor device includes: an internal circuit 93 having plural high withstand voltage transistors 91; and an ESD protection circuit 92 having a protection resistor and two protection diodes. Each of the high withstand voltage transistor 91 is connected to an output terminal 22 via the ESD protection circuit 92.

In a case of the semiconductor device 20 in which each high withstand voltage transistor 1 of the present embodiment is directly connected to the output terminal 22 and a power source terminal, a surge voltage applied from the output terminal 22 or the power source terminal reaches the source or the drain of the high withstand voltage transistor 1. However, since the surge current flows from the high concentration diffusion layer of the drain or source into the semiconductor substrate, the surge voltage is rapidly attenuated, and does not reach a portion nearby the gate electrode.

By: ensuring sufficient metal wiring capable of letting flow a surge current attributed to a surge voltage; ensuring a sufficient area of a drain/source diffusion region for letting out the surge current to the semiconductor substrate 8; and arranging the respective high concentration diffusion layers of the source 6 and drain 5 apart from the gate electrode 4 by an intended amount, the surge current flows from the high concentration diffusion layers of the drain 6 and source 5 into the semiconductor substrate 8, and therefore the surge voltage is rapidly attenuated and does not reach the gate electrode 4. Accordingly, the gate oxidized film 12 is not damaged by the surge voltage. Thus, it is no longer necessary to provide the ESD protection circuit 92 as shown in FIG. 16, and it is possible to realize a circuit in which the output terminal 22 is directly connected to each high withstand voltage transistor 1 as shown in FIG. 15.

The above embodiment deals with an example where the present invention is applied to an N-type high withstand voltage transistor; however, the present invention is also applicable to a P-type high withstand voltage transistor as is the case of the N-type high withstand voltage transistor.

As described, in the present embodiment, a first trench 18 for element isolation is formed on a first conductive semiconductor substrate 8, and a CVD oxidized film 11 is buried in the first trench 18. The impurity concentration at a position of the semiconductor substrate which is 0.5 to 1 μm deeper than the bottom surface of the first trench 18 is set relatively high so that a punch-through withstand voltage between elements is ensured.

Further, to form a high withstand voltage transistor in a portion of the first trench 18, a photoresist in a transistor formation region is removed through a photo lithography. Then, after the first ion 15 of a second conduction type is implanted into the walls on two sides of the first trench 18 in the transistor formation region, the CVD oxidized film 11 in the first trench 18 of the transistor formation region is partially removed, thereby forming a second trench 7.

After that, a gate oxidized film 12 is formed by thermally oxidizing the walls and bottom surface of the second trench 7. Then a gate electrode 4 is buried into the second trench 7. The impurity concentration at the portion of the semiconductor substrate nearby the bottom surface of the second trench 7 is set so that the threshold voltage is set at an intended value.

An insulation film 10 having an intended width for covering the gate electrode 4 is formed. Then, to form the source 5 and drain 6 (high concentration diffusion layers), second ion 16 of a second conduction type is implanted using the insulation film 10 as a mask. Further, a third ion 17 of the second conduction type is implanted so as to form electric field relaxation layers 3 respectively on two sides of the gate electrode 4. The electric field relaxation layers 3 are positioned below two sides of the insulation film 10, and are extended below the source 5 and the drain 6 (high concentration diffusion layers), respectively.

On each side of the trench 7, the electric field relaxation layer 2 and the electric field relaxation layer 3 partially overlap each other, thereby forming a drift diffusion layer. The gate electrode 4 is apart from each of the source 5 and drain 6 (high concentration diffusion layers) by an amount masked by the extended portion of the insulation film 10.

Through the steps, the source 5 and drain 6 (high concentration diffusion layer) formed on sides of the gate electrode 4 buried in the trench 7 respectively serve as source and drain electrodes of the transistor. The drift diffusion regions for relaxing electric field are respectively formed in the walls on the two sides of the trench 7 (in regions respectively covered by two sides of the insulation film 10). A channel region of the transistor is formed on the bottom surface of the trench 7. Thus, a configuration of the high withstand voltage transistor is completed.

As shown in FIG. 2, each drain/source diffusion end B and the gate electrode end A are apart from each other by an amount the extended portions of the insulation film 10 mask implantation of the ion 16 for forming a high concentration diffusion layer. Thus, when a voltage is applied to the region between the drain and source of the high withstand voltage transistor having the above configuration, the electric field at the drift diffusion end B is hardly affected by the electric field at the gate electrode end A, and the breakdown voltage of the transistor is increased.

Further, the depletion layer is expanded perpendicularly to the walls of the trench 7, but is hardly expanded towards the bottom surface of the trench 7. This is because the impurity concentration in a portion of the semiconductor substrate 8 below the bottom surface of the trench 7 is set relatively high. Accordingly, the punch-through withstand voltage of the transistor is hardly decreased even if the bottom surface of the trench 7 is downsized. Thus, a high punch-through withstand voltage is ensured even if the size of the transistor is made extremely small.

Thus, a transistor with an extremely high withstand voltage is realized with an extremely short gate length.

Further, by: (i) setting a relatively low impurity concentration in a portion of the first conductive substrate into which portion the first ion 15 of the second conduction type is implanted; and (ii) setting a relatively high impurity concentration in a portion of the first conductive substrate into which portion the third ion 17 is implanted, it is possible to set an intended conditions for implanting the ions 15, 16, and 17, and to set an intended width of the insulation film 10 covering the gate electrode 4. This allows the source/drain junction withstand voltage to be lower than the transistor withstand voltage by an intended voltage value.

In other words, Each drain/source diffusion region including the electric field relaxation layer 3 and the source 5 or the drain 6 (high concentration diffusion layers) is formed at a different depth of the semiconductor substrate 8 from the depth of the electric field relaxation layer 2 intended to increase the transistor withstand voltage. Therefore, it is possible to set a relatively high impurity concentration in a portion of the semiconductor substrate 8 nearby the electric field relaxation layer 3, and to set a relatively low junction withstand voltage at the source drain diffusion region. On the other hand, it is possible to set a relatively high transistor withstand voltage by: (i) setting a relatively low impurity concentration in a portion of the semiconductor substrate 8 nearby the electric field relaxation layer 3; and (ii) covering the gate electrode 4 with the insulation film 10 having an intended width to keep the gate electrode 4 apart from the source 5 and drain 6 (high concentration diffusion layers) by an intended distance.

In a semiconductor device having such a high withstand voltage transistor, if a surge voltage is applied from an output terminal or a power source terminal, the surge voltage reaches the source and drain of the high withstand voltage transistor, but does not reach the gate electrode. The surge current flows from the respective high concentration diffusion layers of the drain and source into the semiconductor substrate. Therefore, the surge voltage is rapidly attenuated.

In the high withstand voltage transistor connected to the output terminal, by: (i) ensuring sufficient metal wiring capable of letting flow a surge current attributed to a surge voltage; (ii) ensuring a sufficient area of a drain/source diffusion region for letting out the surge current to the semiconductor substrate 8; and (iii) arranging the source and drain (high concentration diffusion layers) apart from the gate electrode 4 by an intended amount, the surge current flows from the drain and source (high concentration diffusion layers) into the semiconductor substrate 8. Therefore the surge voltage is rapidly attenuated and does not reach the gate electrode 4. As a result, the gate oxidized film 12 is not damaged by a surge voltage.

Thus, it is no longer necessary to provide an ESD protection circuit 92 as shown in FIG. 16 for protecting an internal circuit 93 against a surge voltage applied by the output terminal 22 and the power source terminal, and it is possible to realize a circuit in which the output terminal 22 is directly connected to the internal circuit 23, as shown in FIG. 15.

With a high withstand voltage transistor having the above-described configuration, an area of a surface of a semiconductor substrate for forming a drift diffusion layer (electric field relaxation layer) is made substantially zero, while avoiding a change in the function of the electric field relaxation. Thus, it is possible to provide a manufacturing method of a fine high withstand voltage transistor which yields a high withstand voltage with a short gate length.

Further, since it is not necessary to provide an ESD protection circuit for the output terminal and power source terminal, the chip size can be reduced by a large amount. Therefore, it is possible to provide a manufacturing method of a semiconductor device which is suitable for liquid crystal driver in which a large number of output terminals are required at a low cost.

As described, in the present embodiment, a trench is formed, and electric field relaxation layers are formed in the walls of the trench. Thus, an area on the semiconductor substrate taken by the electric field relaxation layer is made substantially zero, and an area taken by a high withstand voltage transistor can be reduced by a large amount (30 to 50%).

Here, it is supposed that distribution of the impurity concentration in the semiconductor substrate 8, and implantation conditions of the ions 15, 16, and 17 are set so that the drain/source junction withstand voltage is 1 to 3 V lower than the withstand voltage of the high withstand voltage transistor.

When a surge voltage is applied to an output terminal of a semiconductor device having such a high withstand voltage transistor, the surge current flows from the output terminal, and from the output terminal to the drain/source diffusion region, and then from the drain/source diffusion region to the semiconductor substrate. By designing the semiconductor device so that the current capacity from the output terminal to the drain/source diffusion region is larger than a surge current, the surge voltage does not reach a portion of the high withstand voltage transistor nearby the gate electrode. This prevents the gate oxidized film 12 from being damaged by the surge voltage/current. Thus, it is not necessary to provide an ESD protection circuit 92. As a result, reduction of the chip size by a large amount (30 to 50%) is possible.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The present invention is applicable to: a high withstand voltage transistor, having a trench structure, for use in a liquid crystal driver or the like; a semiconductor device adopting such a high withstand voltage transistor; and a method of manufacturing the high withstand voltage transistor.

The high withstand voltage transistor of the present embodiment is preferably adapted so that: a substrate impurity concentration of the trench bottom surface is lower than a substrate impurity concentration in each of the first electric field relaxation layers; and that a substrate impurity concentration in a portion below a bottom surface of the trench is higher than a substrate impurity concentration on the bottom surface.

With the configuration, it is possible to set an avalanche breakdown voltage and a punch-through withstand voltage of the transistor at intended values, while avoiding an increase in the threshold voltage.

The high withstand voltage transistor of the present embodiment is preferably adapted so that: a substrate impurity concentration on a surface of the semiconductor substrate is higher than a substrate impurity concentration in each of the first electric field relaxation layers.

The high withstand voltage transistor of the present embodiment is preferably adapted so that: a substrate impurity concentration of the trench bottom surface is lower than a substrate impurity concentration in each of the first electric field relaxation layers.

The high withstand voltage transistor of the present embodiment is preferably adapted so that: a substrate impurity concentration in a portion below a bottom surface of the trench is higher than a substrate impurity concentration on the bottom surface.

The method of the present embodiment of manufacturing a high withstand voltage transistor preferably include the steps of: forming a second trench by removing the CVD oxidized film in the first trench in which the first electric field relaxation layers are formed; and forming a gate oxidized film on bottom and side surfaces of the second trench, and then forming a gate electrode in the second trench.

The method of the present embodiment of manufacturing a high withstand voltage transistor preferably include the steps of: forming an insulation film having an intended width for covering the gate electrode; implanting a second ion of a second conduction type while using the insulation film as a mask, so as to form a source on one side of the insulation film and a drain on another side of the insulation film; and (i) forming second electric field relaxation layers by implanting a third ion of a second conduction type so that one of the second electric field relaxation layers is below the insulation film and is extended so as to surround the source and, and another one of the second electric field relaxation layers is below the insulation film and is extended so as to surround the drain; and (ii) electrically connecting the second electric field relaxation layers with the first electric field relaxation layers.

The method of the present embodiment of manufacturing a high withstand voltage transistor is preferably adapted so that: the first ion is implanted into a position which is shallower than the bottom surface of the first trench.

The method of the present embodiment of manufacturing a high withstand voltage transistor is preferably adapted so that: the third ion is implanted into a position which is shallower than a position where the first ion is implanted, but deeper than a position where the second ion is implanted.

The method of the present embodiment of manufacturing a high withstand voltage transistor is preferably adapted so that: a drain/source junction withstand voltage is set by: (i) a substrate impurity concentration on a surface of the semiconductor substrate; and (ii) implantation of the third ion.

The method of the present embodiment of manufacturing a high withstand voltage transistor is preferably adapted so that: a withstand voltage of the transistor is set by: (i) a substrate impurity concentration on the surface of the semiconductor substrate; (ii) a substrate impurity concentration on the bottom surface of the trench; and (iii) implantation of the first ion.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A high withstand voltage transistor, comprising:
   a gate electrode in a trench formed on a first conductive semiconductor substrate;
   a source and a drain, the source on one side of the gate electrode, and the drain on another side of the gate electrode, the source and the drain being apart from the gate electrode;
   first electric field relaxation layers, one of the first electric field relaxation layers on a wall of the trench on the side of the source and another one of the first electric field relaxation layers on a wall of the trench on the side of the drain;
   second electric field relaxation layers, one of the second electric field relaxation layers between the source and the gate electrode, extended so as to surround the source, and another one of the second electric field relaxation layers between the drain and the gate electrode, extended so as to surround the drain,
   wherein junction withstand voltages of the source and drain are 1 to 3V lower than a withstand voltage of the transistor, and a substrate impurity concentration in a portion below a bottom surface of the trench is higher than a substrate impurity concentration in the substrate at the bottom surface of the trench.

2. The high withstand voltage transistor as set forth in claim 1, wherein:
   a substrate impurity concentration on a surface of the semiconductor substrate is higher than a substrate impurity concentration in each of the first electric field relaxation layers.

3. The high withstand voltage transistor as set forth in claim 1, wherein:
   a substrate impurity concentration of the trench bottom surface is lower than a substrate impurity concentration in each of the first electric field relaxation layers.

4. A semiconductor device, comprising:
   the high withstand voltage transistor as set forth in claim 1; and an output terminal connected to the high withstand voltage transistor.

* * * * *